I

US010159152B2

(12) United States Patent
Campbell et al.

(10) Patent No.: US 10,159,152 B2
(45) Date of Patent: Dec. 18, 2018

(54) DEVELOPMENT OF THE ADVANCED COMPONENT IN CAVITY TECHNOLOGY

(71) Applicant: Intel Corporation, Santa Clara, CA (US)

(72) Inventors: Ladd D. Campbell, Chandler, AZ (US); Scott M. Mokler, Hillsboro, OR (US); Juan Landeros, Jr., Hillsboro, OR (US); Michael J. Hill, Gilbert, AZ (US); Jin Zhao, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 14/977,321

(22) Filed: Dec. 21, 2015

(65) Prior Publication Data

US 2017/0181286 A1 Jun. 22, 2017

(51) Int. Cl.
*H05K 1/00* (2006.01)
*H05K 1/18* (2006.01)
(Continued)

(52) U.S. Cl.
CPC ........... *H05K 1/183* (2013.01); *H05K 1/0231* (2013.01); *H05K 1/181* (2013.01); *H05K 1/113* (2013.01);
(Continued)

(58) Field of Classification Search
CPC .. H05K 1/0254; H05K 1/0286; H05K 1/0287; H05K 1/0289; H05K 1/029;
(Continued)

(56) References Cited

U.S. PATENT DOCUMENTS 6,222,276 B1 * 4/2001 Bertin .................... H01L 23/13
257/713
6,228,682 B1 * 5/2001 Farooq ................... H01L 24/11
257/E21.508
(Continued)

FOREIGN PATENT DOCUMENTS

JP 2006253576 9/2006
KR 10-1190920 10/2012

OTHER PUBLICATIONS

International Search Report and Written Opinion from PCT/US2016/058882, dated Jan. 20, 2017, 13 pages.
(Continued)

*Primary Examiner* — Pete Lee
(74) *Attorney, Agent, or Firm* — Schwabe, Williamson & Wyatt, P.C.

(57) ABSTRACT

Embodiments of the invention include a printed circuit board (PCB) assembly that includes advanced component in cavity (ACC) technology and methods of forming such PCB assemblies. In one embodiment, the PCB assembly may include a PCB that has a cavity formed on a first surface of the PCB. A plurality of contacts may be formed in the cavity. The cavity provides a location where components may be electrically coupled to the PCB. Additionally, a package that is mounted to the PCB may extend over the cavity. Since the package passes directly over the component, the components may be used to electrically couple the package to one or more of the contacts formed in the cavity. Accordingly, embodiments of the invention allow for the surface area used for components to be reduced, and also improves electrical performance of the PCB assembly by positioning the components proximate to the package.

11 Claims, 9 Drawing Sheets

(51) Int. Cl.
*H05K 1/02* (2006.01)
*H05K 1/11* (2006.01)
*H05K 3/34* (2006.01)
*H05K 3/46* (2006.01)

(52) U.S. Cl.
CPC ......... *H05K 3/3436* (2013.01); *H05K 3/3442* (2013.01); *H05K 3/4697* (2013.01); *H05K 2201/09845* (2013.01); *H05K 2201/10015* (2013.01); *H05K 2201/1053* (2013.01); *H05K 2201/10515* (2013.01); *H05K 2201/10734* (2013.01); *Y02P 70/611* (2015.11)

(58) Field of Classification Search
CPC .. H05K 1/0292; H05K 1/0293; H05K 1/0296; H05K 1/14; H05K 1/183; H05K 1/181; H05K 2201/10015; H05K 2201/10734; H05K 1/113; H05K 3/3436
See application file for complete search history.

(56) References Cited

U.S. PATENT DOCUMENTS

| | | | |
|---|---|---|---|
| 7,317,622 B2* | 1/2008 | Li | H05K 1/0212 361/306.3 |
| 7,626,827 B2* | 12/2009 | Nielsen | H01L 23/04 174/260 |
| 2001/0010398 A1 | 8/2001 | Farooq et al. | |
| 2005/0087356 A1* | 4/2005 | Forcier | B81C 1/0023 174/558 |
| 2005/0269687 A1 | 12/2005 | Forcier | |
| 2007/0285907 A1* | 12/2007 | Nishikawa | H01L 23/50 361/763 |
| 2008/0130254 A1* | 6/2008 | Han | H01L 23/5389 361/761 |
| 2012/0293977 A1 | 11/2012 | Sun | |
| 2014/0131084 A1* | 5/2014 | Lee | H05K 1/185 174/260 |
| 2014/0360760 A1* | 12/2014 | Kiwanami | H05K 1/185 174/251 |

OTHER PUBLICATIONS

International Preliminary Report on Patentablity for International Patent Application No. PCT/US2016/058882, dated Jul. 5, 2018, 10 pages.

* cited by examiner

DEVELOPMENT OF THE ADVANCED COMPONENT IN CAVITY TECHNOLOGY

FIELD OF THE INVENTION

Embodiments of the present invention relate generally to the manufacture of semiconductor packages. In particular, embodiments of the present invention relate to a printed circuit board (PCB) assembly with advanced component in cavity (ACC) technology and methods for manufacturing such devices.

BACKGROUND OF THE INVENTION

Capacitors are an important component in power delivery management in PCB assemblies. The capacitors may be located at various positions in or on the electronic package or the PCB on which the package is mounted. For example, capacitors are commonly positioned on the package (e.g., land-side capacitors), on the PCB (e.g., PCB edge capacitors or backside capacitors), or embedded within the PCB.

However, there are drawbacks to placing capacitors at each of these locations. For example, land-side capacitors require that the overall size of the package be increased. Accordingly, there is an increase in the cost of the package. Alternatively, PCB edge capacitors occupy valuable real-estate on the motherboard, and backside capacitors increase the overall Z-height of the assembly. Embedding the capacitors within the PCB saves real-estate, but are an expensive solution to implement. Additionally, embedding the capacitors within the PCB disrupts the core routing layers of the PCB.

Accordingly, there is a need for a cost-effective capacitor placement solution for PCB assemblies.

DETAILED DESCRIPTION OF THE INVENTION

Described herein are systems that include a semiconductor package and methods of forming such semiconductor packages. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Embodiments of the invention include mounting capacitors or other components on a PCB assembly that overcome the deficiencies such as those described above. The capacitor mounting configuration described with respect to embodiments may be generally referred to as advanced component in cavity (ACC) mounting. According to embodiments of the invention, the ACC mounting provides significant improvements in packaging power delivery applications. For example, when the components are capacitors, the ACC mounting may be used to position decoupling capacitors as close as possible to the power and ground planes in the full grid array (FGA) without growing package size. Furthermore, the use of ACC mounting may allow for components to be removed from the backside of the PCB. Eliminating the need to place components on the backside of the PCB allows for single side PCB assembly. Accordingly, the cost of the device is decreased and the manufacturability of the devices is improved. While the use of capacitors as the component in ACC based PCB assemblies is described extensively herein, it is to be appreciated that additional embodiments of the invention may include ACC based PCB assemblies where the component is any other discrete device. For example, a crystal may be a component in an ACC when there is a need for an oscillator, or any other passive component (e.g., an inductors, a resistor, etc.) may be included as well.

Figure 1:
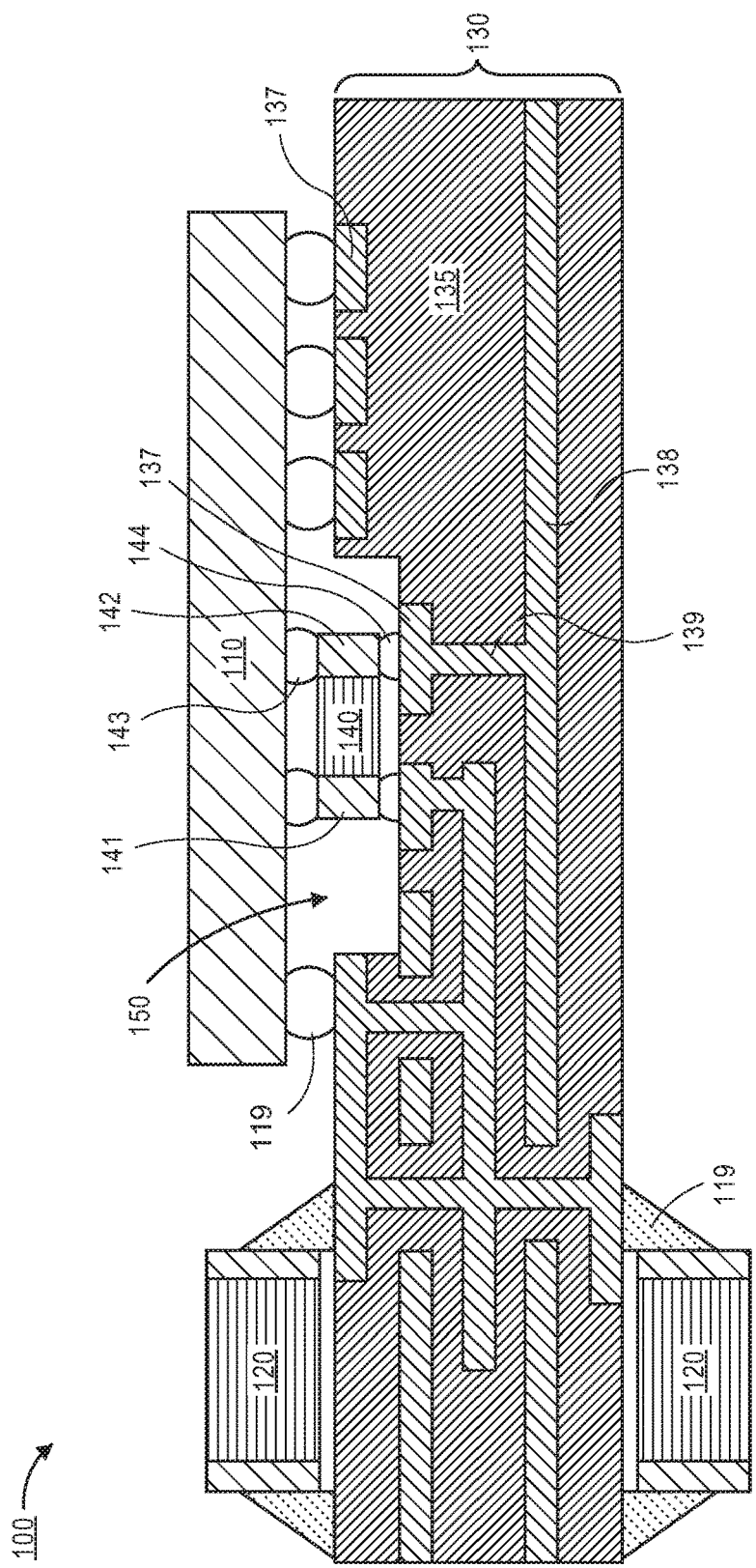
FIG. 1 is a cross-sectional illustration of a printed circuit board (PCB) assembly with a cavity below a package and a component formed in the cavity, according to an embodiment of the invention.

Referring now to FIG. 1A, a cross-sectional illustration of a portion of a PCB 130 is shown according to an embodiment of the invention. Embodiments of the invention include any suitable materials for the PCB 130. For example, the PCB 130 may include a substrate 135 that mechanically supports and electrically connects components together. In the illustrated embodiment, the substrate 135 is shown as being as single layer, though it is to be appreciated that the PCB 130 may include a plurality of dielectric layers 135 laminated in a stack (as will be described in greater detail below). The PCB 130 may also include a plurality of conductive traces 138 and vias 139 formed at different levels in the PCB 130. Typically, the conductive traces 138 and vias 139 are a copper material, though embodiments of the invention are not limited to such configurations. The conductive traces 138 and vias 139 provide electrical signal routing and power delivery to the components 140, 120, and the package 110 mounted to the PCB 130. In the illustrated embodiment, the conductive traces 138 and vias 139 are simplified in order to not unnecessarily obscure the invention (i.e., all routing layers, ground planes, and power planes of the complete PCB 130 may not be illustrated in the Figures).

According to an embodiment, one or more components 120 may be located on the top surface or the back surface of the PCB 130. The components 120 may be any desired components needed (e.g., actives, passive, ICs, etc.). Typically, the components 120 may be mounted to the PCB 130 with any suitable conductive material, such as solder 119.

In an embodiment, a package 110 is formed on the top surface of the PCB 130. According to an embodiment, the package 110 may include any number of active or passive devices. For example, the package 110 may include one or more semiconductor dice (not shown) that include integrated circuitry, such as a microprocessor, a graphic processing unit (GPU), a memory chip, or the like. While a package 110 is illustrated and described as being directly connected to the PCB 130, it is to be appreciated that the package 110 may also be one package that is mounted on an interposer or other module substrate that is then attached to the PCB 130. Embodiments of the invention include a package 110 that is mounted to the pads 137 on the surface of the PCB 130 with suitable conductive interconnects. For example, the package 110 may be attached with solder bumps 119.

As described above, a PCB 130 typically includes a number of additional components 140 in order to improve the electrical performance of the assembly. In one embodiment, the additional components 140 may be capacitors. In order to prevent these additional components from reducing the usable surface area of the PCB 130, increasing the thickness of the PCB 130, and/or increasing the cost of fabricating the PCB 130, embodiments of the invention include one or more cavities 150 on the surface of the PCB 130 that are capable of accommodating components 140. According to an embodiment, the one or more cavities 150 may be formed under the footprint of the package 110.

As illustrated, one or more components 140 may be mounted to the PCB 130 on the bottom surface of the cavity 150. For example, conductive pads 137 may be formed along the bottom surface of the cavity to provide electrical connections to the a first terminal 141 and a second terminal 142 of each component 140. By way of example, the component 140 may be mounted to the conductive pads 137 with solder bumps or solder preforms 144. In one embodiment where the component 140 is a decoupling capacitor, the first terminal 141 may be attached to a pad 137 coupled to a power plane and the second terminal 142 may be attached to a pad 137 that is coupled to the ground plane. The first terminal 141 and the second terminal 142 may also be directly coupled to the package 110 by solder bumps 143. Accordingly, the component 140 provides a conductive path from the package 110 directly to the PCB 130 even when the package 110 is formed over a cavity 150.

Such a configuration is particularly beneficial when a capacitor is used as the component 140. For example, moving the capacitor closer to the package 110 (i.e., closer to the package as compared to a PCB edge capacitor or a PCB backside capacitor) reduces the impedance profile of the device. Decoupling capacitors are most effective when positioned as close as possible to the device requiring the decoupled signal (e.g., the package 110), because the inductance of the conductive line between the capacitor 140 and the package 110 increases with length. Accordingly, positioning the capacitor closer to the package 110 reduces the amount of line inductance between the capacitor 140 and the package 110 and therefore, reduces the impedance. For example, depending on the number of capacitors used and the dimensions of the PCB, replacing PCB backside capacitors with capacitors located in a cavity 150 directly below the package 110 may decrease the maximum impedance by half or more. Additionally, positioning capacitors 140 in a cavity 150 instead of on the backside of the PCB 130 may increase the resonant frequency to beyond 40 MHz when used in conjunction with currently available packages. This significant increase in performance available when embodiments of the invention are used may provide an increase of approximately one to two bin boost with currently available packaged processors.

In addition to performance increases in the assembly, embodiments of the invention have manufacturing and size reduction advantages as well. The manufacturability of the assembly may be increased over the manufacturability of assemblies that utilize back side capacitors for several reasons. First, if all components (i.e., the decoupling capacitors 140 and any additional needed components 120) are removed from the backside of the PCB 130, then a single sided assembly process may be used. Limiting the mounting of components to a single side also allows for a single reflow step to be used. Furthermore, this increase in performance is made possible without sacrificing valuable surface area of the PCB 130 since the capacitors 140 occupy the same surface area that is used by the package 110. Accordingly, the overall size of the PCB assembly may be reduced and/or more components may be mounted to the PCB 130.

Additional embodiments of the invention allow for versatile cavity formations and/or solder bump sizes that allow for the inclusion of any desired number and/or size of components in the cavity. Some exemplary configurations according to embodiments of the invention are illustrated and described with respect to FIGS. 2A-2E. FIGS. 2A-2E are each cross-sectional illustrations of a portion of the PCB assembly that are zoomed in to highlight the cavities and the components within the cavities. Accordingly, additional components, conductive lines, and vias in the PCB may be omitted for simplicity.

Figure 2A:
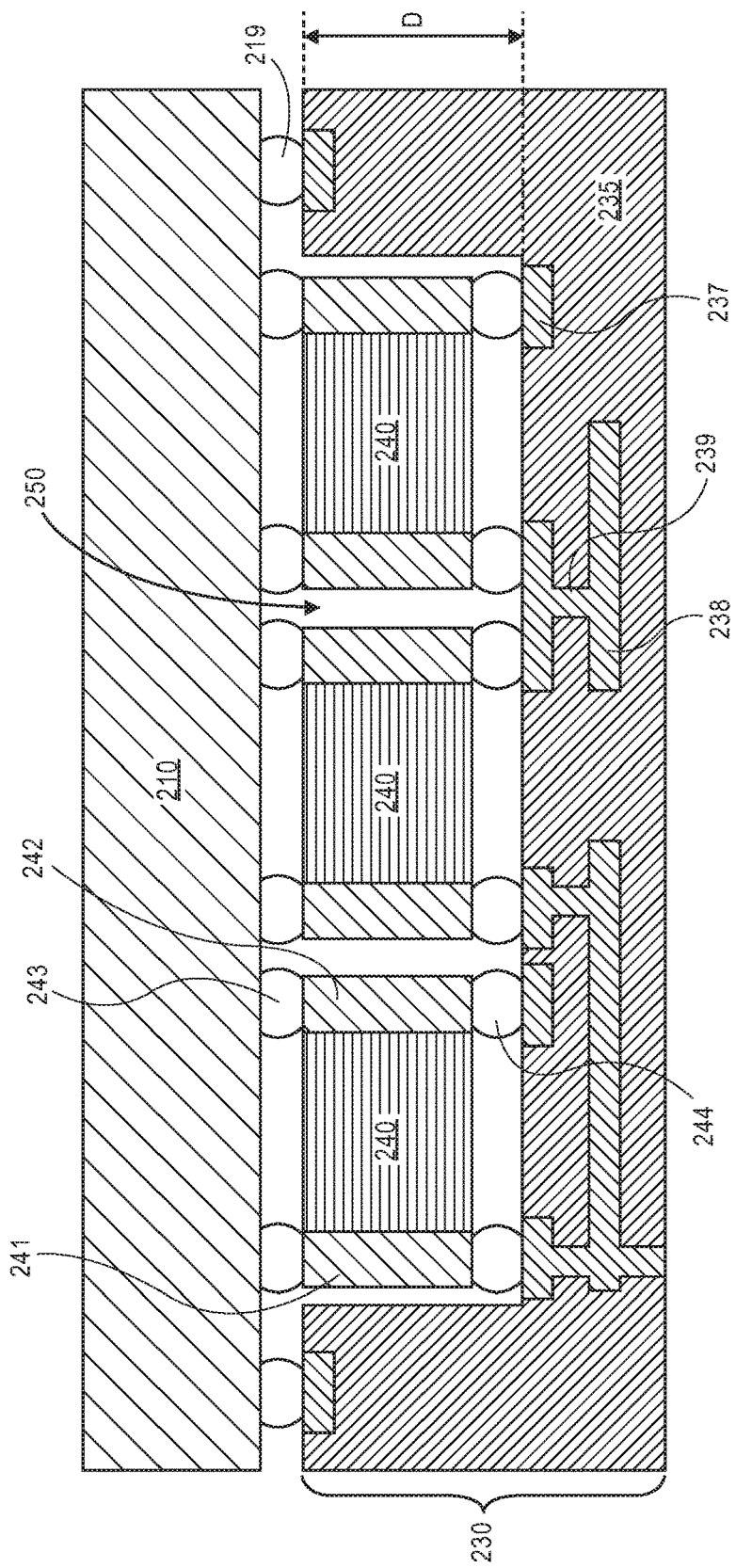
FIG. 2A is a cross-sectional illustration of a portion of a PCB assembly with a cavity below a package and a plurality of components formed in the cavity, according to an embodiment of the invention.

Referring now to FIG. 2A, a cross-sectional illustration of a cavity 250 that is sized to accommodate a plurality of components 240 is shown according to an embodiment of the invention. According to an embodiment, the cavity 250 may be a consistent depth D. This configuration may be beneficial when each of the plurality of components 240 are a similar thickness. As such, the components 240 may be mounted in the cavity 250 with solder bumps 244 and 243 that are substantially similar in size. While a cavity 250 that is sized to accommodate three components 240 is shown, embodiments of the invention are not limited to such configurations. For example, the cavity may be any size up to having approximately the same width as the package 210.

Accordingly, embodiments of the invention may include a cavity that is able to accommodate all of the components 240 needed for a given package. In one embodiment, the cavity 250 may be sized to accommodate one hundred or more components 240. In a particular embodiment, the cavity 250 may accommodate over one hundred-fifty components 240. Increasing the size of the cavity 250 may save a significant amount of surface area on the PCB 230. For example, when the components 240 are 0201 capacitors (i.e., capacitors with a 0.6 mm×0.3 mm dimensions), positioning all of the capacitors 240 needed for power management in a cavity 250 below the package 210 may save over approximately 100 $mm^2$ in typical CPU based assemblies that require over one hundred capacitors.

Figure 2B:
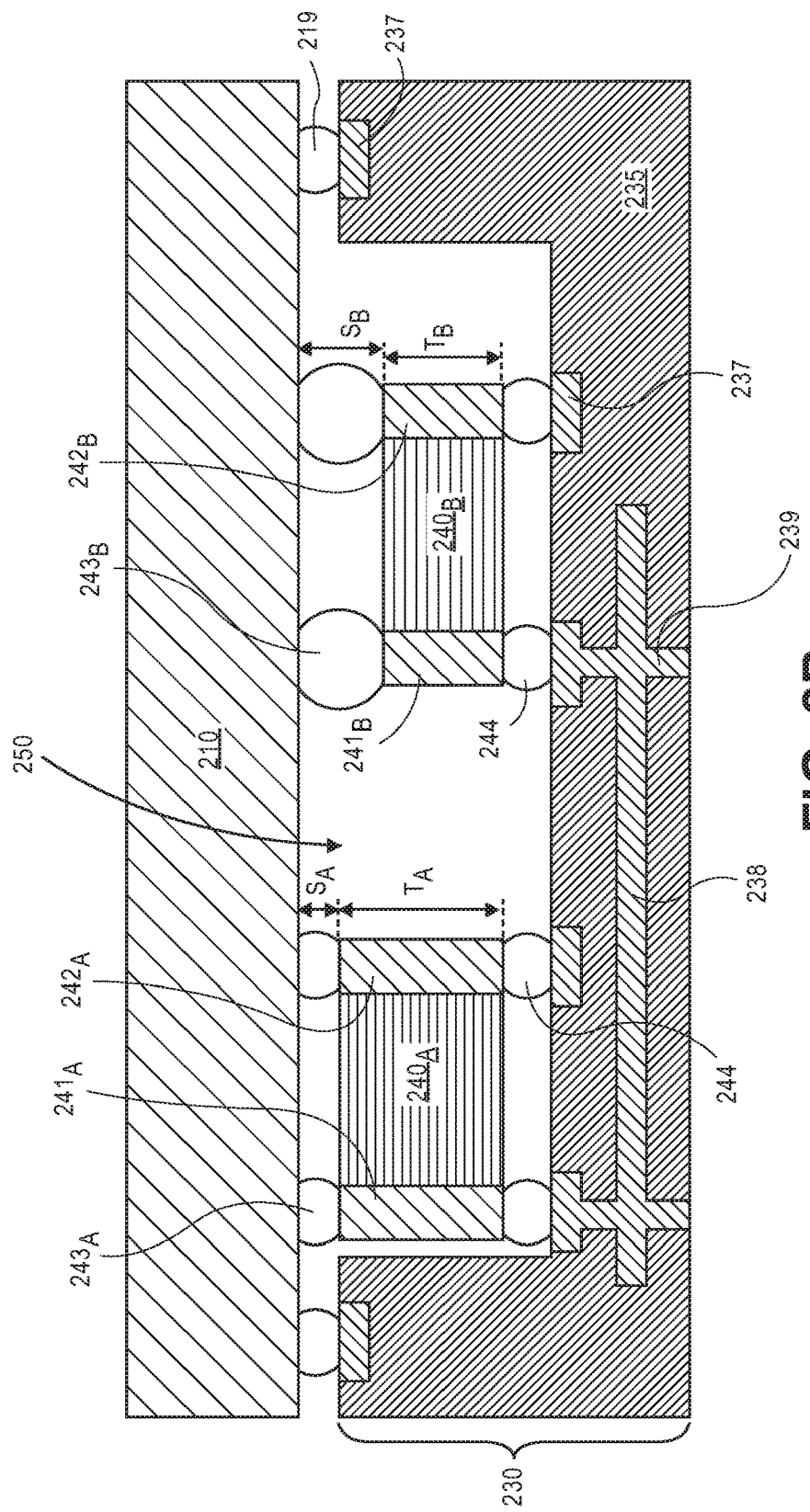
FIG. 2B is a cross-sectional illustration of a portion of a PCB assembly with a cavity below a package and a first component and a second component with different thicknesses formed in the cavity, according to an embodiment of the invention.

Referring now to FIG. 2B, a cross-sectional illustration of a cavity 250 that includes components 240 with different thicknesses is shown according to an embodiment of the invention. As illustrated, a first component $240_A$ has a first thickness $T_A$ that is greater than a second thickness $T_B$ of a second component mounted in the same cavity 250. In order to allow both components $240_A/240_B$ to make a connection to the package 210, the difference between the thicknesses of the $T_A$ and $T_B$ needs to be accounted for. In one embodiment, the smaller thickness $T_B$ may be augmented by increasing the height $S_B$ of the solder bumps $243_B$ that connect the second component $240_B$ to the package 210 relative to the height $S_A$ of the solder bumps $243_A$ that connect the first component $240_A$ to the package 210. Alternatively, it is to be appreciated that a similar result may be produced by utilizing solder bumps $243_A$ and $243_B$ that are the same height and utilizing solder bumps $244_A$ and $244_B$ that have different heights, or by having both the solder bumps $243_A/244_A$ being a different height than solder bumps $243_B/244_B$, respectively.

As such, embodiments of the invention allow for diverse selection of components 240 that may be needed for any given device. For example, when the components 240 are both capacitors, the capacitors may have different capacitances. Additional embodiments allow for different types of components 240 to be used in a single cavity 250. For example, the first component $240_A$ may be a capacitor and the second component $240_B$ may be a crystal or any other discrete active or passive device.

Figure 2C:
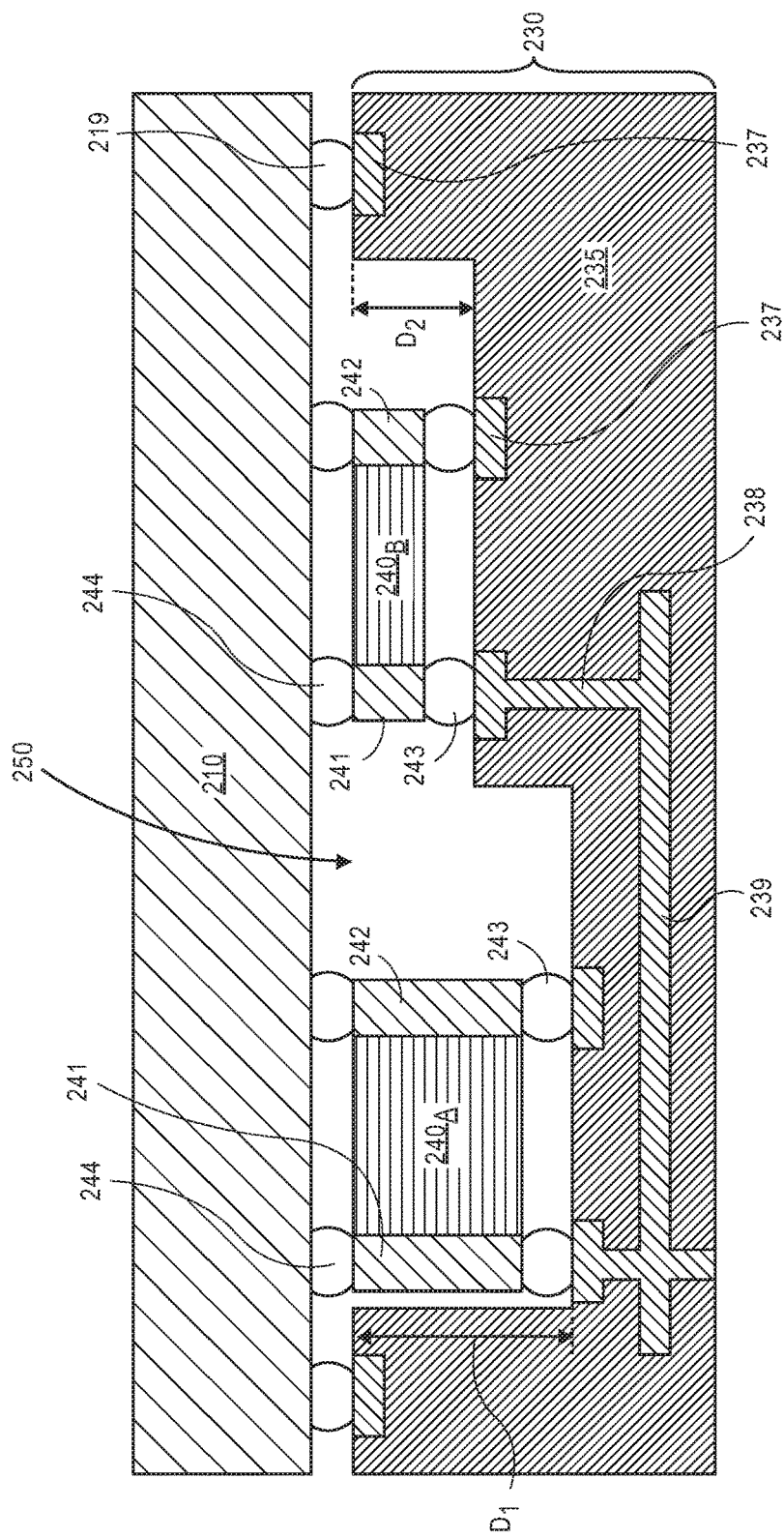
FIG. 2C is a cross-sectional illustration of a portion of a PCB assembly with a cavity below a package that includes a stepped surface, according to an embodiment of the invention.

Referring now to FIG. 2C, a cross-sectional illustration of cavity 250 with a stepped surface is shown according to an embodiment of the invention. According to an embodiment, the cavity 250 may be formed to have different depths in order to accommodate components 240 with different thicknesses. For example, the illustrated cavity 250 includes a first depth $D_1$ and a second depth $D_2$. The use of a cavity 250 with a variable depth allows for components 240 with different thicknesses to be mounted in a single cavity 250. For example, a first component $240_A$ may have first thickness $T_A$ that is greater than a second thickness $T_B$ of a second component mounted in the same cavity 250. The differences in the depth of different portions of the cavity 250 allows for both components $240_A/240_B$ to be able to contact the PCB 230 and the package 210 without needing to adjust the size of the solder bumps 243/244. While a single step is shown in FIG. 2B, it is to be appreciated that any number of stepped surfaces may be included in the cavity 250.

Similar to the device illustrated in FIG. 2B, this stepped cavity configuration allows for diverse selection of components 240 that may be needed for any given device. For example, when the components 240 are both capacitors, the capacitors may have different capacitances. Additional embodiments allow for different types of components 240 to be used in a single cavity 250. For example, the first component $240_A$ may be a capacitor and the second component $240_B$ may be a crystal or any other discrete active or passive device.

Furthermore, it is to be appreciated that forming a stepped surface does not significantly complicate the processing needed to form the cavity 250. As will be described in greater detail below, the cavity may be formed with a laser drilling process. As such, the differences in the depths $D_1$ and $D_2$ may be accounted for by changing the number of passes of a laser drill over the different regions. Additionally, the inclusion of laser stops (described in greater detail below) will allow for easy identification of when each region of the cavity 250 reaches the desired depth $D_1$ and or $D_2$.

Figure 2D:
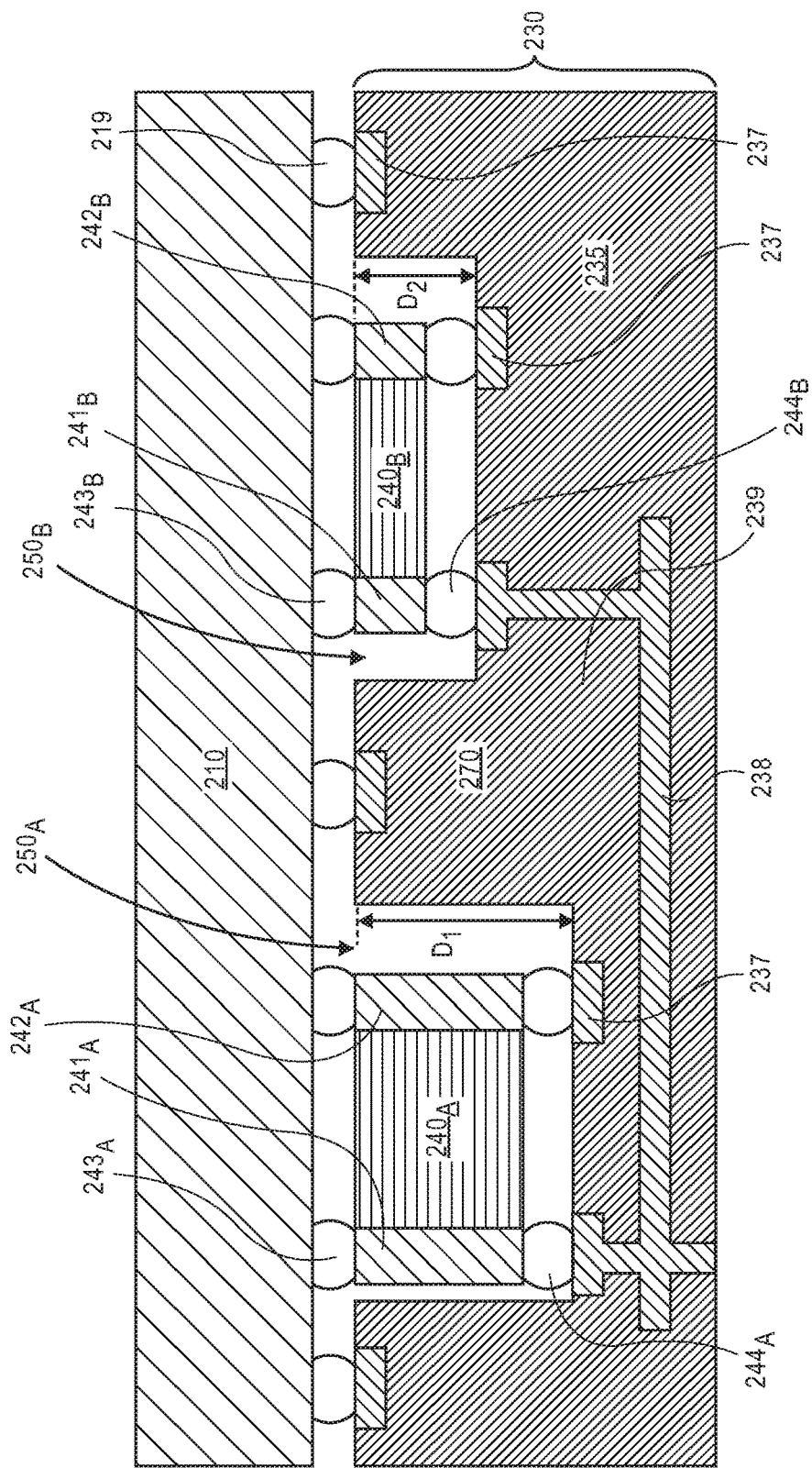
FIG. 2D is a cross-sectional illustration of a portion of a PCB assembly with two separate cavities formed below a package, according to an embodiment of the invention.

Referring now to FIG. 2D, a cross-sectional illustration of a PCB assembly with a plurality of cavities 250 is shown according to an embodiment of the invention. In embodiments of the invention, a plurality of cavities 250 may be used when the components 240 are needed in different regions of the package 210. For example, a first cavity $250_A$ is formed below a first portion of the package 210 and a second cavity $250_B$ is formed below a second portion of the package 210. Forming separate cavities 250 may increase the throughput. For example, if components 240 are not needed in a region 270 of the PCB 230 between a first component $240_A$ and a second component $240_B$, then the dielectric material 235 may not need to be removed. As such, the laser drilling time may be reduced, since the dielectric material 235 in region 270 does not need to be ablated. Additionally, leaving regions below the package 210 at the original thickness allows for connections to be made directly from the package 210 to the PCB 230.

According to embodiments of the invention with a plurality of cavities 250, the depth D of the cavities may be the same or the depth may be varied. For example, in FIG. 2D the first cavity $250_A$ has a depth $D_1$ that is greater than the depth $D_2$ of the second cavity $250_B$. As such, components 240 with different thicknesses may be used, similar to the embodiments described above in FIGS. 2B and 2C.

Figure 2E:
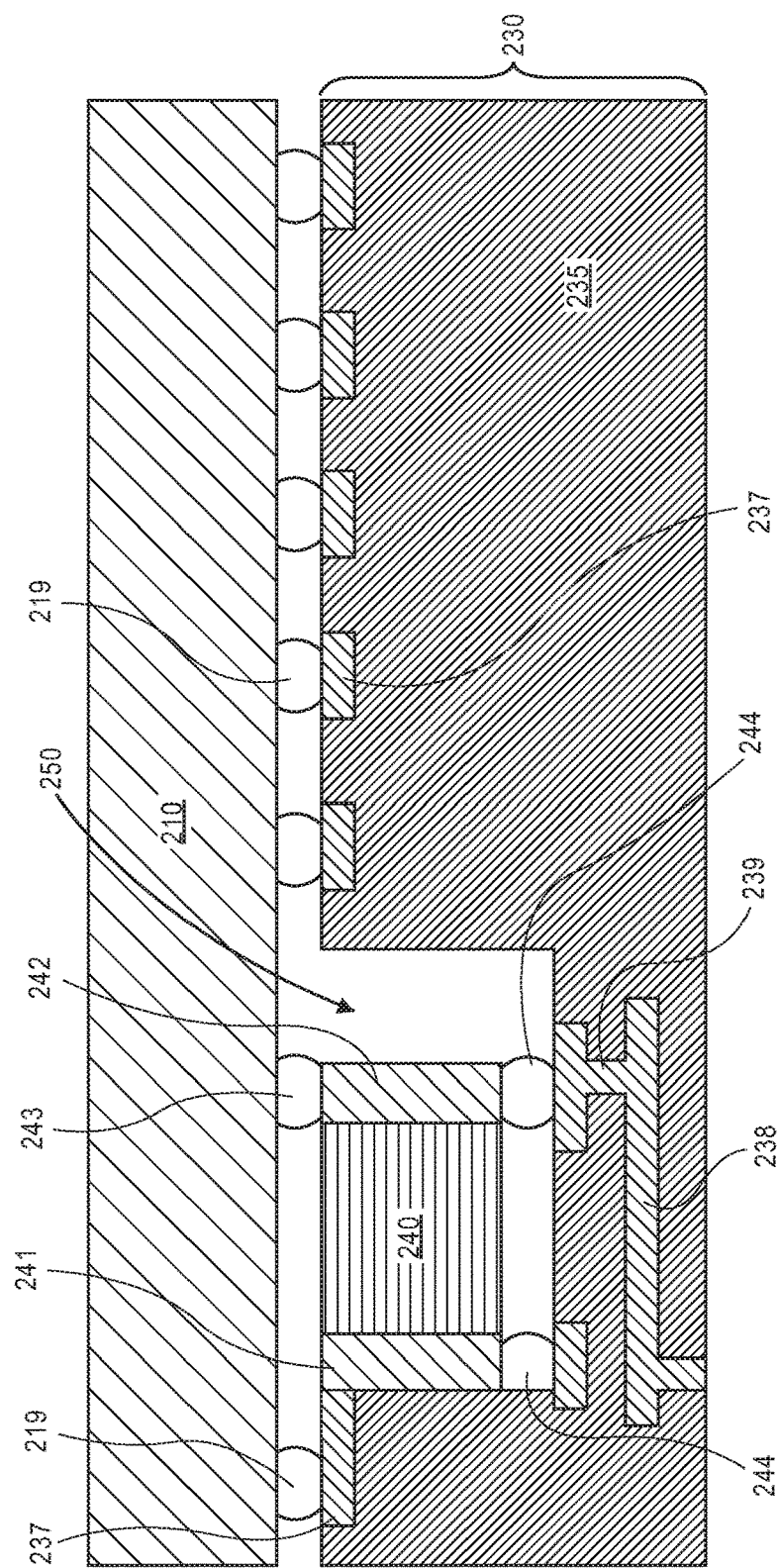
FIG. 2E is a cross-sectional illustration of a portion of a PCB assembly with a cavity that includes a component that is latterly coupled to a conductive pad on the surface of the PCB, according to an embodiment of the invention.

Referring now to FIG. 2E, a cross-sectional illustration of a cavity 250 that includes a component 240 that is laterally coupled to a pad 237 on the top surface of the PCB 230 is shown according to an embodiment of the invention. In an embodiment, the terminals 241/242 may be formed along a sidewall of a component 240. As such, an electrical connection may be formed along the sidewall of the component 240 instead (or in addition to) the top surface of the component 240. This may be advantageous when a conductive pad or trace 237 ends at the edge of the cavity 250. Accordingly, the terminal may be laterally connected to the pad 237 which is attached to the package 210 with a solder bump 219. In an embodiment, a solder material (not shown) may be formed between the terminal 241 the edge of the pad 237 in order to enhance the reliability of the connection. In the illustrated embodiment, only the first terminal 241 includes a lateral connection and the second terminal 242 is connected to the package 210 in the same manner described in the remainder of the application. However, it is to be appreciated that if the cavity 250 is formed with a width that is substantially similar to the width of the component 240 (including the terminals 241/242) then a lateral connection may be formed on both sides of the component 240.

Embodiments of the invention also include a process for forming advanced component in cavity ACC based PCB assemblies. Unlike embedded component technologies, the cavity formation process does not necessitate that lower conductive lines be altered in order to rout connections to the component. There is no rerouting needed because the components may be directly mounted to the package. One example of a process flow for forming an ACC based PCB assembly is illustrated and described with respect to FIGS. 3A-3D.

Figure 3A:
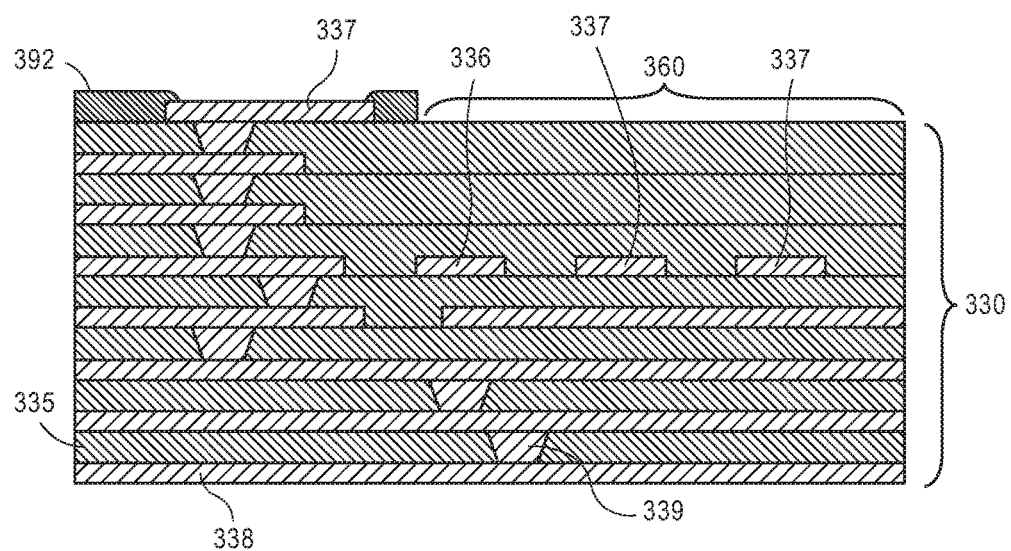
FIG. 3A is a cross-sectional illustration of a portion of a PCB prior to forming a cavity, according to an embodiment of the invention.

Referring now to FIG. 3A, a cross-sectional illustration of a PCB 330 is shown according to an embodiment of the invention. As illustrated, the PCB 330 may include a stack of dielectric layers 335, conductive lines 388, and vias 389. The top surface of the PCB 330 may include one or more pads 337. A solder resist 392 may also be formed over portions of the top surface of the PCB 330 to prevent solder from shorting to neighboring pads or conductive lines.

According to an embodiment of the invention, the PCB 330 may also include a cavity region 360. The cavity region 360 may be the region of the PCB 330 in which the cavity 350 will be formed in a subsequent processing operation. According to an embodiment, the cavity region 360 may include one or more layers of dielectric material 335 that is free from conductive lines 338 or vias 339. At the bottom of the cavity region one or more conductive pads 337 and/or laser stops 336 may be formed, according to an embodiment. The laser stop 336 may be a material that is not readily ablated by the laser used to drill the cavity in a subsequent processing operation. By way of example, the laser stops 336 may be a metallic material, such as copper. Additional embodiments may include a laser stop 336 that also functions as a pad 337. For example, the laser stop 336 may be coupled to a ground plane or a power plane. The pads 337 may be formed at the same depth in the PCB 330 as the laser stop 336. Accordingly, when the laser stop 336 is exposed by the laser drilling process, it will be known that the pads 337 are also exposed with similar laser processing.

In the illustrated embodiment, a single laser stop 336 is illustrated, though embodiments of the invention are not limited to such configurations. For example, if a cavity with varying depths is desired (e.g., a cavity similar to the one illustrated in FIG. 2C, more than one laser stop 336 may be included. In such an embodiment, a laser stop may be positioned at each desired depth needed for the stepped cavity.

Figure 3B:
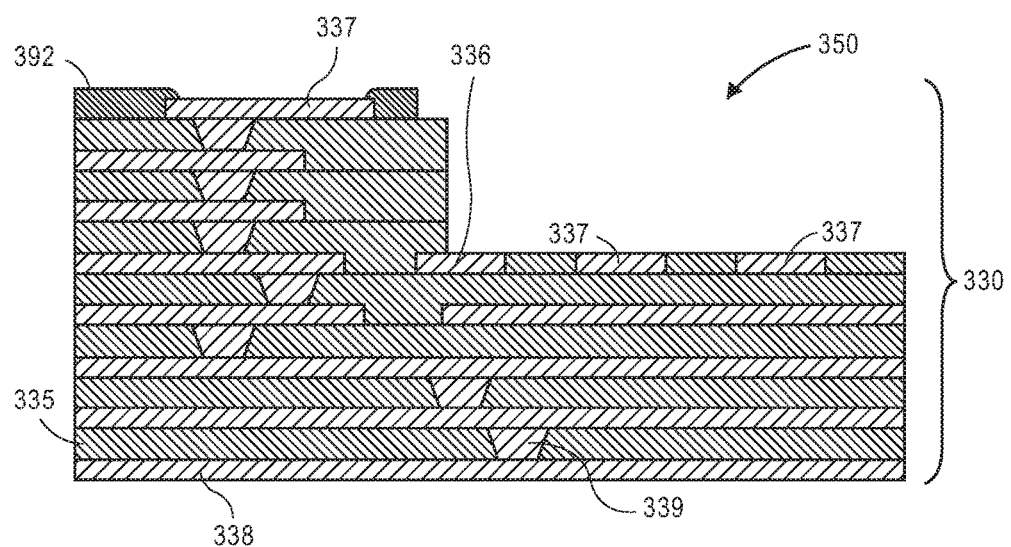
FIG. 3B is a cross-sectional illustration of a portion of a PCB after the cavity is formed in the PCB, according to an embodiment of the invention.

Referring now to FIG. 3B, a cross-sectional illustration of the PCB after a cavity 350 is formed is shown according to an embodiment of the invention. In an embodiment the cavity 350 may be formed with a laser drilling process. Embodiments may include passing the laser over the cavity region 360 in a raster pattern. For example, the laser may be a $CO_2$ laser, a UV laser, such as an excimer laser, or the like. According to an embodiment, the laser drilling process may be used to ablate the dielectric material 335 in the cavity region 360 of the PCB 330 until the laser stop 336 is exposed. In the illustrated embodiment a single cavity 350 is shown, but it is to be appreciated that the laser drilling process may be used to form a plurality of cavities 350 in the PCB 330. In one embodiment a plurality of lasers may be used to form multiple cavities 350 simultaneously and/or be used to increase the speed of forming a single cavity 350.

Figure 3C:
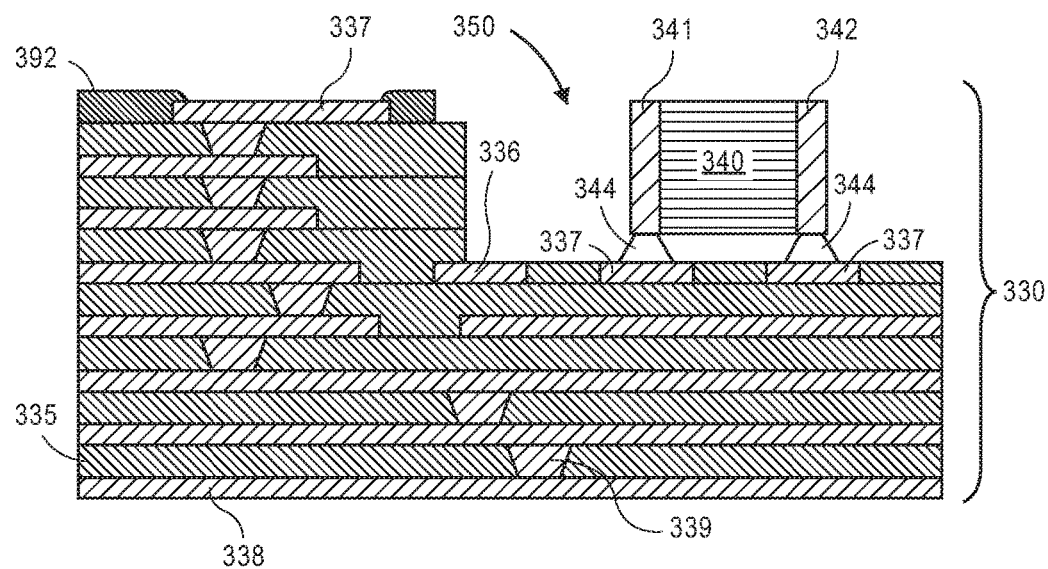
FIG. 3C is a cross-sectional illustration of a portion of a PCB after a component is mounted in the cavity, according to an embodiment of the invention.

Referring now to FIG. 3C, a cross-sectional illustration of the PCB 330 after a component 340 is mounted in the cavity 350 is shown according to an embodiment of the invention. Often, solder bumps are printed with a screen printing process. However, the difficulty of screen printing is increased when cavities are formed over the surface. Accordingly, some embodiments of the invention may include mounting the components 340 with solder preforms 344 that are attached to the component prior to mounting the component 340 on the pads 337 in the cavity 350. According to an embodiment the solder preforms 344 may include any solder and flux needed to provide proper attachment to the contacts 337 after a reflow process.

According to an embodiment of the invention, the components 340 that are mounted in the cavity 350 may be mounted with a pick and place tool. In some embodiments of the invention, a plurality of components 340 may be mounted at substantially the same time. For example, the component 340 may be mounted onto the pads 337 in the cavity 350 with a pick and place tool that is capable of transferring an array of components.

Figure 3D:
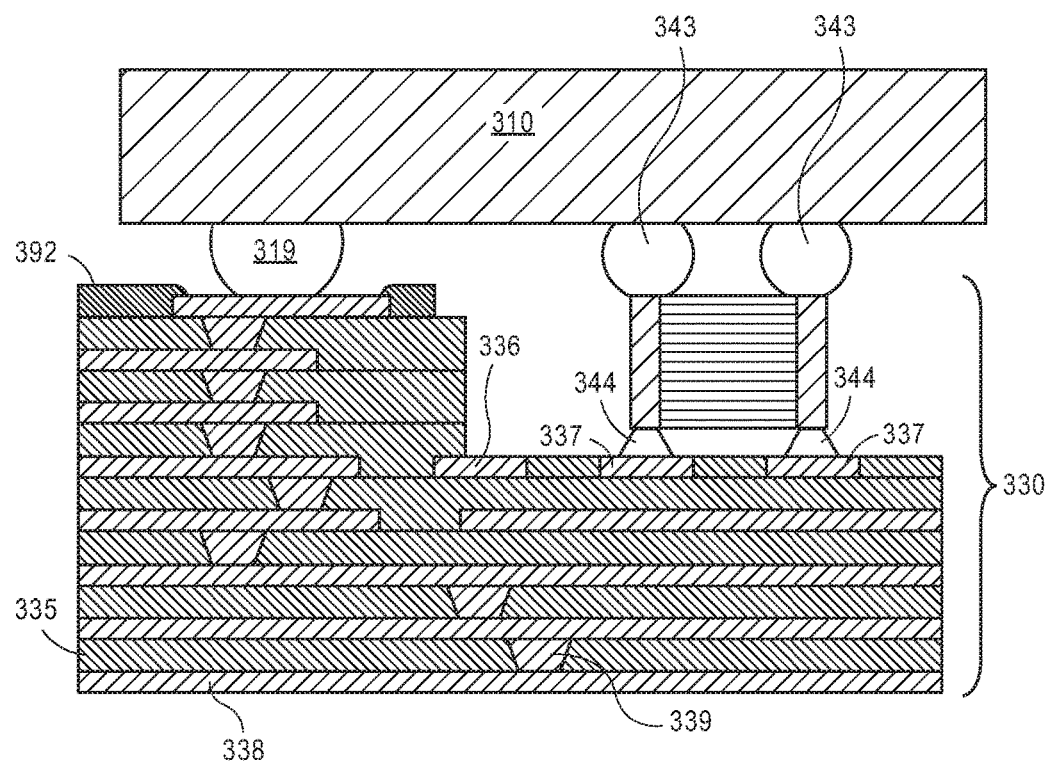
FIG. 3D is a cross-sectional illustration of a portion of a PCB assembly after a package is mounted to the surface of the PCB over the cavity and the component, according to an embodiment of the invention.

Referring now to the FIG. 3D, a cross-sectional illustration of a PCB assembly after a package 310 is mounted to a top surface of the PCB 330 and the top surface of the component 340. As illustrated, the package 310 may extend above the cavity 350 and the component 340 provides support from below. Additionally, the component 340 provides an electrical path directly from the package 310 to the PCB 330. As illustrated, the package 310 may be mounted to the PCB 330 with any suitable connection method, such as with solder bumps 319/343. The solder bumps 343 may be directly connected to terminals 341/342 of the component 340. As such, the direct electrical path may include a conductive path from the package 310 through a solder bump 343 to the component 340, and from the component 340 through a solder preform 344 to the pad 337 on the PCB 330. After the package 310 is placed on the PCB 330, embodiments of the invention may include a reflow process that is used to reflow all of the solder bumps 319, 343, and preforms 344 in order to provide secure and reliable connections for the device.

Accordingly, embodiments of the invention allow for an decrease in the impedance of the PCB assembly by locating the components directly below the package 310. Furthermore, when there are no components on the backside of the PCB (e.g., when back side capacitors are replaced with capacitors mounted in the cavity) the single reflow may be the only reflow needed to assemble the PCB assembly. As such, the throughput is increased and the cost of the PCB assembly is decreased. Additionally, positioning the components 340 directly below the package 310 preserves surface area on the PCB 330 that may be used for additional components.

Figure 4:
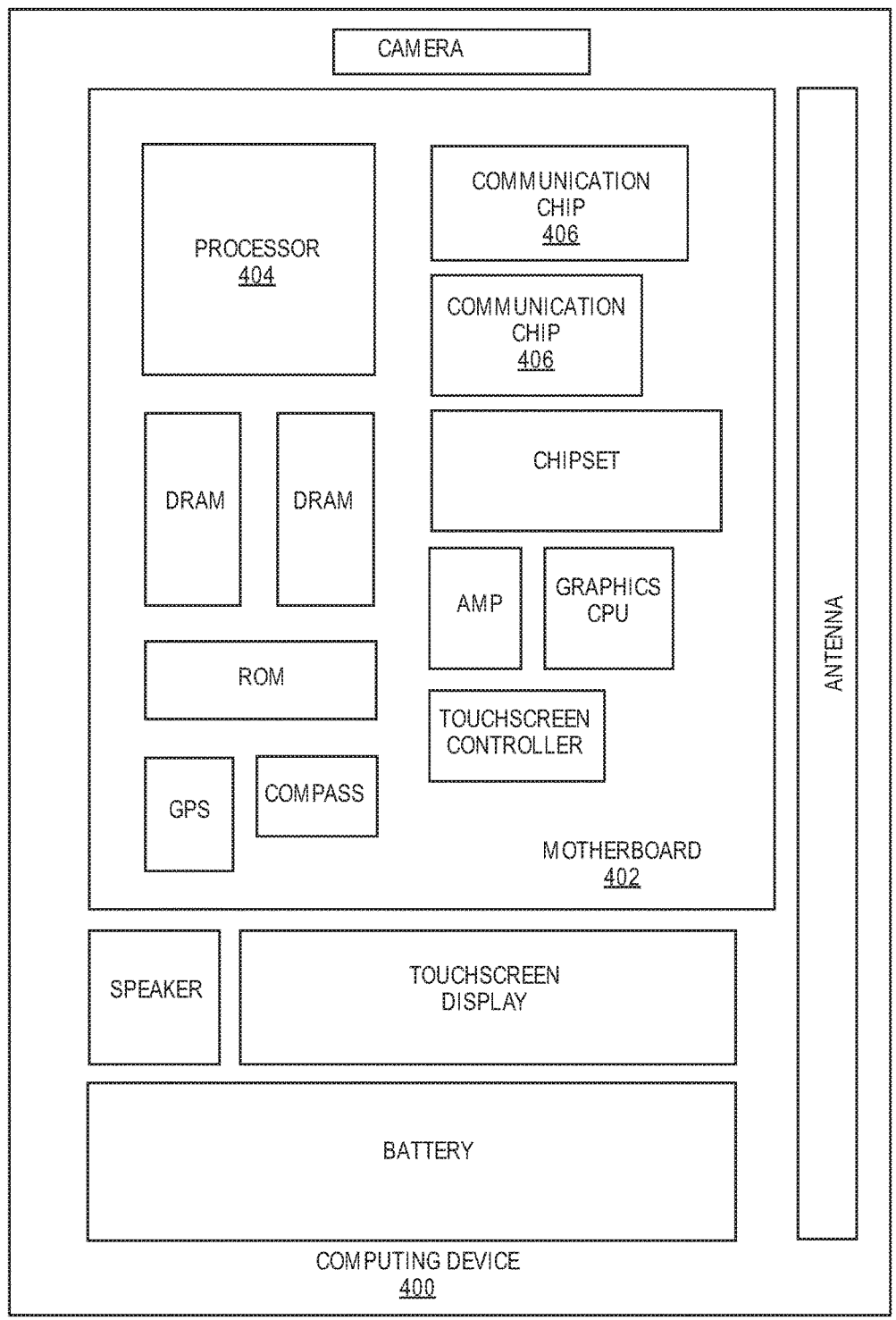
FIG. 4 is a schematic of a computing device built in accordance with an embodiment of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor may be included in a package that is mounted over a cavity in a PCB and is electrically coupled to the PCB by one or more components formed in the cavity, in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip may be included in a package that is mounted over a cavity in a PCB and is electrically coupled to the PCB by one or more components formed in the cavity, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a printed circuit board (PCB) assembly, comprising: a PCB with a cavity formed on a first surface of the PCB, wherein a plurality of contacts are formed in the cavity; a component electrically coupled to one or more of the contacts formed in the cavity; a package mounted to the PCB, wherein the package extends over the cavity, and wherein the component electrically couples the package to one or more of the contacts formed in the cavity.

Additional embodiments of the invention include a PCB assembly, wherein the component is a capacitor.

Additional embodiments of the invention include a PCB assembly, wherein the capacitor includes a first terminal that is electrically coupled to a power plane and a second terminal that is electrically coupled to a ground plane.

Additional embodiments of the invention include a PCB assembly, wherein a plurality of components are mounted in the cavity.

Additional embodiments of the invention include a PCB assembly, wherein a first component of the plurality of components has a first thickness and a second component of the plurality of components has a second thickness that is smaller than the first thickness.

Additional embodiments of the invention include a PCB assembly, wherein the second thickness is augmented solder bumps that couple the second component to the package that have a greater height than a height of solder bumps used to couple the first component to the package.

Additional embodiments of the invention include a PCB assembly, wherein the cavity includes a stepped surface, wherein the first component is located at a first portion of the cavity that has a first depth and the second component is located at a second portion of the cavity that has a second depth.

Additional embodiments of the invention include a PCB assembly, further comprising a plurality of cavities formed on the first surface of the PCB.

Additional embodiments of the invention include a PCB assembly, wherein a first component is located in the first cavity and a second component is located in the second cavity.

Additional embodiments of the invention include a PCB assembly, wherein the first cavity has a first depth and the second cavity has a second depth that is greater than the first cavity.

Additional embodiments of the invention include a PCB assembly, wherein the component includes a first terminal that is laterally connected to a pad on a top surface of the PCB.

Additional embodiments of the invention include a PCB assembly, wherein a solder bump electrically couples the package to the pad that is laterally connected to the first terminal.

Embodiments of the invention include a method of forming a printed circuit board (PCB) assembly, comprising: forming a PCB that includes a cavity region, wherein the cavity region includes a laser stop and a contact embedded within a dielectric material used to form the PCB; forming a cavity in the cavity region be removing portions of the dielectric material used to form the PCB, wherein the laser stop and the contact are exposed during the formation of the cavity; mounting a component to the contact in the cavity; and mounting a package to the PCB, wherein the package extends over the cavity, and wherein the component electrically couples the package to the contact formed in the cavity.

Additional embodiments of the invention include a method, wherein the cavity is formed with a laser drilling process.

Additional embodiments of the invention include a method, wherein the laser is a $CO_2$ laser or a UV laser.

Additional embodiments of the invention include a method, wherein the component is mounted in the cavity with a pick and place tool.

Additional embodiments of the invention include a method, wherein an array of components are mounted in the cavity at substantially the same time with the pick and place too.

Additional embodiments of the invention include a method, wherein a solder preform is formed on the component prior to being mounted in the cavity, wherein the solder preform includes solder and flux.

Additional embodiments of the invention include a method, wherein a single reflow process is used to reflow solder bumps and solder preforms on the PCB assembly.

Additional embodiments of the invention include a method, wherein forming the cavity includes forming a stepped cavity that includes a first portion with a first depth and a second portion with a second depth.

Additional embodiments of the invention include a method, wherein a first laser stop is formed in the first portion of the cavity and a second laser stop is formed in the second portion of the cavity.

Additional embodiments of the invention include a method, wherein a first laser is used to form the first portion of the cavity and a second laser is used to form the second portion of the cavity.

Embodiments of the invention include a printed circuit board (PCB) assembly, comprising: a PCB with a cavity formed on a first surface of the PCB, wherein a plurality of contacts and one or more laser stops are formed in the cavity; a plurality of capacitors mounted in the cavity, wherein each capacitor is electrically coupled to a ground plane and a power plane in the PCB; and a package mounted to the PCB, wherein the package extends over the cavity, and wherein the plurality of capacitors each electrically couple the package to the ground plane and the power plane.

Additional embodiments of the invention include a PCB assembly, wherein no capacitors are mounted on a second surface of the PCB that is opposite from the first surface of the PCB.

Additional embodiments of the invention include a PCB assembly, wherein the plurality of capacitors includes at least one hundred capacitors.

What is claimed is:

1. A printed circuit board (PCB) assembly, comprising: a PCB with a plurality of cavities formed on a first surface of the PCB, wherein a plurality of contacts are formed in each cavity; a component electrically coupled to one or more of the contacts formed in each of the cavities, wherein a first component is located in a first cavity and a second component is located in a second cavity, and wherein the first cavity has a first depth and the second cavity has a second depth that is greater than the first depth, and wherein the first cavity and the second cavity are different cavities formed into the first surface of the PCB, wherein at least one of the first component and the second component includes a first terminal along a sidewall of the component that is laterally connected to a pad on a top surface of the PCB that ends at an edge of the first cavity or the second cavity; and a package mounted to the PCB, wherein the package extends over the cavities, and wherein the first component and the second component electrically couples the package to one or more of the contacts formed in the first cavity and the second cavity.

2. The PCB assembly of claim 1, wherein at least one of the first and second components is a capacitor.

3. The PCB assembly of claim 2, wherein the capacitor includes a first terminal that is electrically coupled to a power plane and a second terminal that is electrically coupled to a ground plane.

4. The PCB assembly of claim 1, wherein a plurality of components are mounted in at least one of the cavities.

5. The PCB assembly of claim 4, wherein the first component of the plurality of components has a first thickness and the second component of the plurality of components has a second thickness that is smaller than the first thickness.

6. The PCB assembly of claim 5, wherein the second thickness is augmented by solder bumps that couple the second component to the package that have a greater height than a height of solder bumps used to couple the first component to the package.

7. The PCB assembly of claim 5, wherein the cavity includes a stepped surface, wherein the first component is located at a first portion of the cavity that has a first depth and the second component is located at a second portion of the cavity that has a second depth.

8. The PCB assembly of claim 1, wherein a solder bump electrically couples the package to the pad that is laterally connected to the first terminal.

9. A printed circuit board (PCB) assembly, comprising:
a PCB with a plurality of cavities formed on a first surface of the PCB, wherein a plurality of contacts and one or more laser stops are formed in each of the cavities, wherein a first cavity has a first depth and a second cavity has a second depth that is greater than the first depth, and wherein the first cavity and the second cavity are different cavities formed into the first surface of the PCB;
a plurality of capacitors mounted in each of the cavities, wherein each capacitor is electrically coupled to a ground plane and a power plane in the PCB, wherein at least one of the capacitors includes a first terminal along a sidewall of the capacitor that is laterally connected to a pad on a top surface of the PCB that ends at an edge of one of the cavities; and
a package mounted to the PCB, wherein the package extends over the cavity, and wherein the plurality of capacitors each electrically couple the package to the ground plane and the power plane.

10. The PCB assembly of claim 9, wherein no capacitors are mounted on a second surface of the PCB that is opposite from the first surface of the PCB.

11. The PCB assembly of claim 10, wherein the plurality of capacitors includes at least one hundred capacitors.

* * * * *